United States Patent
Lin

(10) Patent No.: US 11,038,507 B2
(45) Date of Patent: Jun. 15, 2021

(54) SWITCH ASSEMBLY AND CONTROL METHOD THEREOF

(71) Applicant: GEMTEK TECHNOLOGY CO., LTD., Hsinchu (TW)

(72) Inventor: Chih-Cheng Lin, Hsinchu (TW)

(73) Assignee: GEMTEK TECHNOLOGY CO., LTD., Hsinchu (TW)

( * ) Notice: Subject to any disclaimer, the term of this patent is extended or adjusted under 35 U.S.C. 154(b) by 153 days.

(21) Appl. No.: 16/111,166

(22) Filed: Aug. 23, 2018

(65) Prior Publication Data

US 2020/0067505 A1    Feb. 27, 2020

(51) Int. Cl.
| | |
|---|---|
| *H03K 17/693* | (2006.01) |
| *H02J 1/08* | (2006.01) |
| *H01H 1/58* | (2006.01) |
| *H02M 3/158* | (2006.01) |
| *H03M 5/00* | (2006.01) |

(52) U.S. Cl.
CPC ......... *H03K 17/693* (2013.01); *H01H 1/5833* (2013.01); *H02J 1/08* (2013.01); *H02M 3/1588* (2013.01); *H03M 5/00* (2013.01)

(58) Field of Classification Search
CPC ....... H03K 17/693; H01H 1/5833; H02J 1/08; H02M 3/1588
See application file for complete search history.

(56) References Cited

U.S. PATENT DOCUMENTS

| | | | | |
|---|---|---|---|---|
| 5,712,910 | A * | 1/1998 | Saito | H04M 3/2272 379/350 |
| 7,847,440 | B2 * | 12/2010 | Mosebrook | H05B 39/08 307/139 |
| 8,022,577 | B2 * | 9/2011 | Grice | H05B 47/10 307/114 |
| 8,212,424 | B2 * | 7/2012 | Mosebrook | H05B 39/08 307/139 |
| 9,751,412 | B2 * | 9/2017 | Im | H02J 7/0047 |
| 9,928,975 | B1 * | 3/2018 | Johnson | H02M 7/10 |
| 9,966,779 | B2 * | 5/2018 | Ziv | H05B 39/041 |
| 2002/0044466 | A1 * | 4/2002 | Randazzo | H05B 41/2856 363/56.02 |
| 2007/0176788 | A1 * | 8/2007 | Mor | G08C 17/02 340/13.24 |
| 2013/0194840 | A1 * | 8/2013 | Huselstein | H02H 7/1206 363/50 |
| 2015/0266388 | A1 * | 9/2015 | Im | B60L 53/305 320/109 |
| 2016/0057841 | A1 * | 2/2016 | Lenig | H05B 45/50 315/291 |

(Continued)

*Primary Examiner* — Rexford N Barnie
*Assistant Examiner* — Kalu Kelly Emeaba

(57) ABSTRACT

A power switch comprises a SPDT switch having a common side and a switch side; a first isolation switch electrically connected at the common side of the SPDT switch and a second isolation switch electrically connected at the switch side of the SPDT switch; a microprocessor for detecting a current direction and controlling the conduction state of one of the first isolation switch and the second isolation switch in response to the detected current direction; and a power converter converting AC power to DC power for powering the first isolation switch, the second isolation switch and the microprocessor.

8 Claims, 4 Drawing Sheets

(56) References Cited

U.S. PATENT DOCUMENTS

2016/0075251 A1\* 3/2016 Choi ................... B60L 11/1848
                                                              320/109
2016/0239033 A1\* 8/2016 Pan ..................... H04W 56/001
2017/0086281 A1\* 3/2017 Avrahamy ........... H05B 39/088
2017/0358843 A1\* 12/2017 Huang ................. H04B 7/0868

\* cited by examiner

SWITCH ASSEMBLY AND CONTROL METHOD THEREOF

BACKGROUND

Technical Field

The present disclosure relates to the field of power switches, and in particular, to an intelligent power switch.

Related Art

A switch assembly comprising switch elements combined into a three-way or four-way wiring geometry enables users to operate a circuit from multiple locations. For example, it is desirable to have a light switch at each entrance to a room. Generally, two switches are commonly used in homes and other places to control the same lamp. Here the two switches must be single-pole double-throw switches. Such switches may be used for controlling the light installed upstairs. One switch is installed in the upstairs and the other is installed in the downstairs. The two switches may be used to turn on or turn off the light installed upstairs. The light may be turned on when the user is at downstairs and may be turned off when the user goes upstairs. By way of such configuration either switch can be operated to control the illumination of the light.

With the evolution of household applications, the performance required of switching devices is also changing. Advanced power devices with built-in intelligence such as self-protection and diagnostic functions are changing the traditional household switches. Therefore, more electrical components such as microprocessor are installed in the switch to implement the intelligent function. In order to power these electrical components, a power converter is also required for the switch.

SUMMARY

The disclosure is related to a power switch and a control method for a power switch.

According to one embodiment, the disclosure provides a power switch comprising a SPDT switch having a common side and a switch side; a first isolation switch electrically connected at the common side of the SPDT switch and a second isolation switch electrically connected at the switch side of the SPDT switch; a microprocessor for detecting a current direction and controlling the conduction state of one of the first isolation switch and the second isolation switch in response to the detected current direction; and a power converter converting AC power to DC power for powering the first isolation switch, the second isolation switch and the microprocessor.

According to one embodiment, the disclosure provides a control method for a power switch, the power switch comprising a SPDT switch having a common side and a switch side, a first isolation switch electrically connected at the common side of the SPDT switch and a second isolation switch electrically connected at the switch side, the method comprising detecting a current direction of the power switch; and controlling the conduction state of one of the first isolation switch and the second isolation switch in response to the detected current direction.

According to one embodiment, the disclosure provides a power switch device comprising a switch having a load side adapted to connect to a load and a power side; a microprocessor for wirelessly sending a control command having a control status corresponding to the current conduction state of the switch in response to the conduction state of the switch, or controlling the conduction state of the switch in response to the received control command having a control status; and a power converter converting AC power to DC power for powering the microprocessor.

According to one embodiment, the disclosure provides a control method for a power switch comprising a switch having a load side adapted to connect to a load and a power side and a microprocessor, the method comprising: detecting a conduction state of the switch; and wirelessly sending a control command having a control status corresponding to the current conduction state of the switch in response to the conduction state of the switch, or controlling the conduction state of the switch in response to the received control command having a control status.

It should be understood, however, that this summary may not contain all aspects and embodiments of the present invention, that this summary is not meant to be limiting or restrictive in any manner, and that the invention as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DESCRIPTION OF THE EMBODIMENTS

Figure 1:
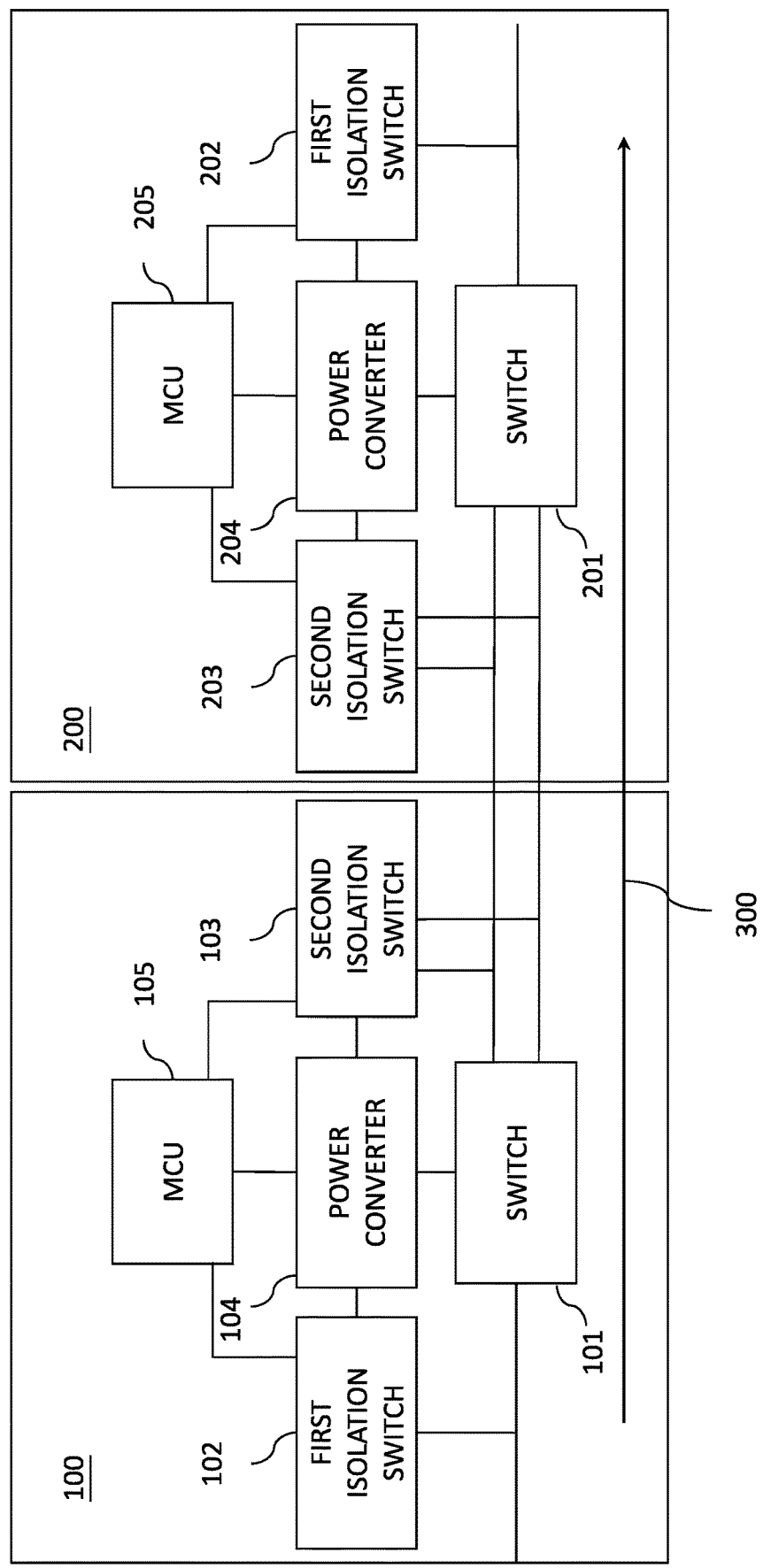
FIG. 1 is a schematic diagram of the power switches according to the first embodiment of the disclosure.

The present disclosure will now be described more fully hereinafter with reference to the accompanying drawings, in which exemplary embodiments of the invention are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/substantially" means, within an acceptable error range, the person skilled in the art may solve the technical problem in a certain error range to achieve the basic technical effect. Additionally, the term "couple" or "connect" covers any direct or indirect electrically coupling means. Therefore, when one device is electrically connected to another device in the context, that connection may be through a direct electrical connection, or through an indirect electrical connection via other devices and connections. The following description is of the best-contemplated mode of carrying out the invention. This description is made for the purpose of illustration of the general principles of the invention and should not be taken in a limiting sense. The scope of the invention is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals is used to refer to the same or similar elements throughout the disclosure.

Refer to FIG. 1 showing a schematic diagram of the power switches according to the first embodiment of the disclosure.

The figure illustrates a configuration including two power switches 100, 200. The two power switches 100 and 200 have the same configuration. The arrow 300 indicates the direction of the current flow. In this embodiment, the current flows from the power switch 100 to the power switch 200. Therefore, the power switch 100 may be referred as the former stage, and the power switch 200 may be referred as the latter stage. If the current flows from the power switch 200 to the power switch 100, the power switch 200 may be referred as the former stage, and the power switch 100 may be referred as the latter stage.

The power switch 100 includes a single pole double throw (SPDT) switch 101, a first isolation switch 102, a second isolation switch 103, a power converter 104 and a microprocessor 105. The power converter 104 receives AC power and converts the AC power to DC power for powering the first isolation switch 102 and the second isolation switch 103 and the microprocessor 105. The SPDT switch 101 includes a common side and a switch side. The SPDT switch 101 includes three terminals. The first terminal constitutes the common side, and the second terminal and the third terminal constitute the switch side. When the first terminal is electrically connected to the second terminal, the power switch 100 is in the conduction state. When the first terminal is electrically connected to the third terminal, the power switch 100 is not in the conduction state. The common side of the SPDT switch 101 may be electrically connected to a hot line when the power switch is installed. The switch side of the SPDT switch 101 may be electrically connected to the switch side of the SPDT switch 201.

The first isolation switch 102 is electrically connected at the common side of the SPDT switch 101. The second isolation switch 103 is electrically connected at the switch side of the SPDT switch 101.

The microprocessor 105 is electrically connected to the first isolation switch 102 and the second isolation switch 103. The microprocessor 105 detects a current direction and controls the conduction state of one of the first isolation switch 102 and the second isolation switch 103 in response to the detected current direction.

When the current flows from the first isolation switch 102 to the second isolation switch 103, the first isolation switch 102 may be referred to as the former stage and the second isolation switch 103 may be referred to as the latter stage. When the SPDT switch 101 is turned off, the current would flow from the first isolation switch 102 to the second isolation switch 103 even though the SPDT switch 101 is turned off. Therefore, the microprocessor 105 controls the conduction state of one of the first isolation switch 102 and the second isolation switch 103 to be off when the microprocessor 105 detects the current flowing from the common side of the power switch 100 to the switch side of the power switch 100.

The current direction may be detected by way of detecting the voltage difference between the first terminal and the second terminal of the SPDT switch 101. The detected voltage difference between the first terminal and the second terminal of the SPDT switch 101 indicates the current flows from the common side of the power switch 100 to the switch side of the power switch 100. In this case, the power switch 100 is determined as the former stage. Therefore, the microprocessor 105 may control the conduction state of the first isolation switch 102 to be off. Alternatively, the microprocessor 105 may also control the conduction state of the second isolation switch 103 to be off.

In one embodiment, the first isolation switch 102 may be a photo coupler or a photo triac. The second isolation switch 103 may be a photo coupler or a photo triac.

The power switch 200 includes a single pole double throw (SPDT) switch 201, a first isolation switch 202, a second isolation 203, a power converter 204 and a microprocessor 205. In this embodiment, the current flows from the second isolation switch 203 to the first isolation switch 202. The power converter 204 receives AC power and converts the AC power to DC power for powering the first isolation switch 202 and the second isolation switch 203 and the microprocessor 205. The SPDT switch 201 includes a common side and a switch side. The SPDT switch 201 includes three terminals. The first terminal constitutes the common side, and the second terminal and the third terminal constitute the switch side. When the first terminal is electrically connected to the second terminal, the power switch 200 is in the conduction state. When the first terminal is electrically connected to the third terminal, the power switch 200 is not in the conduction state. The common side of the SPDT switch 201 may be electrically connected to a neutral line when the power switch is installed. The switch side of the SPDT switch 201 may be electrically connected to the switch side of the SPDT switch 101. As shown in the figure, when the power switch 100 and the power switch 200 are used together, the switch side of the power switch 100 is connected to the switch side of the power switch 200. The first isolation switch 202 is configured at the common side. The second isolation switch 203 is configured at the switch side.

The microprocessor 205 is electrically connected to the first isolation switch 202 and the second isolation switch 203. The microprocessor 205 detects a current direction and controls the conduction state of one of the first isolation switch 202 and the second isolation switch 203 in response to the detected current direction.

When the current flows from the second isolation switch 203 to the first isolation switch 202, the second isolation switch 203 may be referred to as the former stage and the first isolation switch 202 may be referred to as the latter stage. When the SPDT switch 201 is turned off, the current would flow from the second isolation switch 203 to the first isolation switch 202 even though the SPDT switch 201 is turned off. Therefore, the microprocessor 205 controls the conduction state of the first isolation switch 202 to be off when the microprocessor 205 detects the current flowing from the second isolation switch 203 to first isolation switch 202.

The current direction may be detected by way of detecting the voltage difference between the first terminal and the second terminal of the SPDT switch 201. The detected voltage difference between the first terminal and the second terminal of the SPDT switch 201 indicates the current flows from the switch side of the power switch 200 to the common side of the power switch 200. In this case, the power switch 200 is determined as the latter stage. Therefore, the microprocessor 205 may only control the conduction state of the first isolation switch 202 to be off.

In one embodiment, the first isolation switch 202 may be a photo coupler or a photo triac. The second isolation switch 203 may be a photo coupler or a photo triac.

Figure 2:
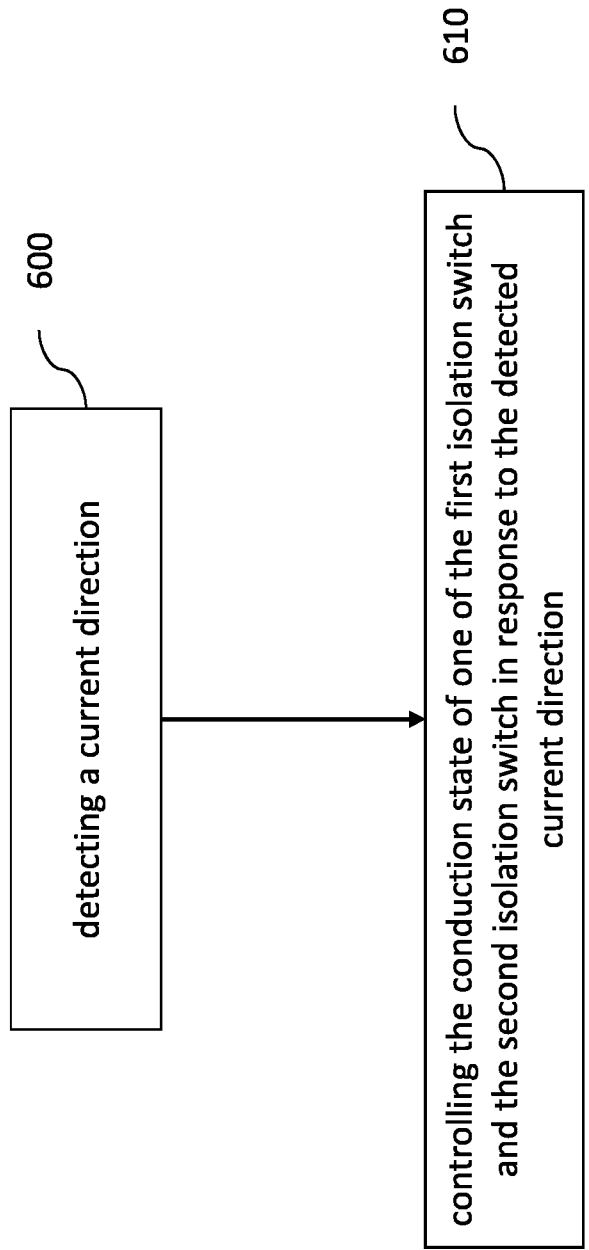
FIG. 2 is a flow chart showing the control method of the power switches according to the second embodiment of the disclosure.

FIG. 2 is a flow chart showing the control method of the power switches according to the second embodiment of the disclosure.

In particular, FIG. 2 shows the flow chart of the microprocessor. The control method of this embodiment is used for the configuration of the power switch as illustrated in the first embodiment. Refer to the description set forth for the configuration of the power switches.

In the embodiment, when the electrical path is formed between the SPDT switch 101 and the SPDT switch 201, the current direction is first detected (Step 600).

The first terminal of the SPDT switch 101 constitutes the common side, and the second terminal and the third terminal of the SPDT switch 101 constitute the switch side. The connection of the first terminal and the second terminal forms the conduction state of the SPDT switch 101 and enables the current flow. The first terminal of the SPDT switch 201 constitutes the common side, and the second terminal and the third terminal of the SPDT switch 201 constitute the switch side. The connection of the first terminal and the second terminal forms the conduction state of the SPDT switch 201 and enables the current flow. However, the configuration of the first isolation switch and the second isolation switch in the power switch may result in a malfunction of the power switch. Therefore, one of the first isolation switch and the second isolation switch needs to be turned off. In order to determine which isolation switch needs to be turned off, the direction of the current needs to be detected.

The current direction of the power switch 100 may be detected by way of detecting the voltage difference between the first terminal and the second terminal of the SPDT switch 101. The current direction of the power switch 200 may be detected by way of detecting the voltage difference between the first terminal and the second terminal of the SPDT switch 201.

Then the method involves controlling the conduction state of one of the first isolation switch and the second isolation switch in response to the detected current direction (Step 610).

The detected voltage difference between the first terminal and the second terminal of the SPDT switch 101 indicates the current flows from the common side of the SPDT switch 101 to the switch side of the SPDT switch 101. In such case, either the first isolation switch 102 or the second isolation switch 103 needs to be turned off. Therefore, the method involves controlling the conduction state of one of the first isolation switch 102 and the second isolation switch 103 to be off.

The detected voltage difference between the first terminal and the second terminal of the SPDT switch 201 indicates the current flows from the switch side of the SPDT switch 201 to the common side of the SPDT switch 201. In such case, the first isolation switch 202 needs to be turned off. Therefore, the method involves controlling the conduction state of the first isolation switch 202 to be off.

Figure 3:
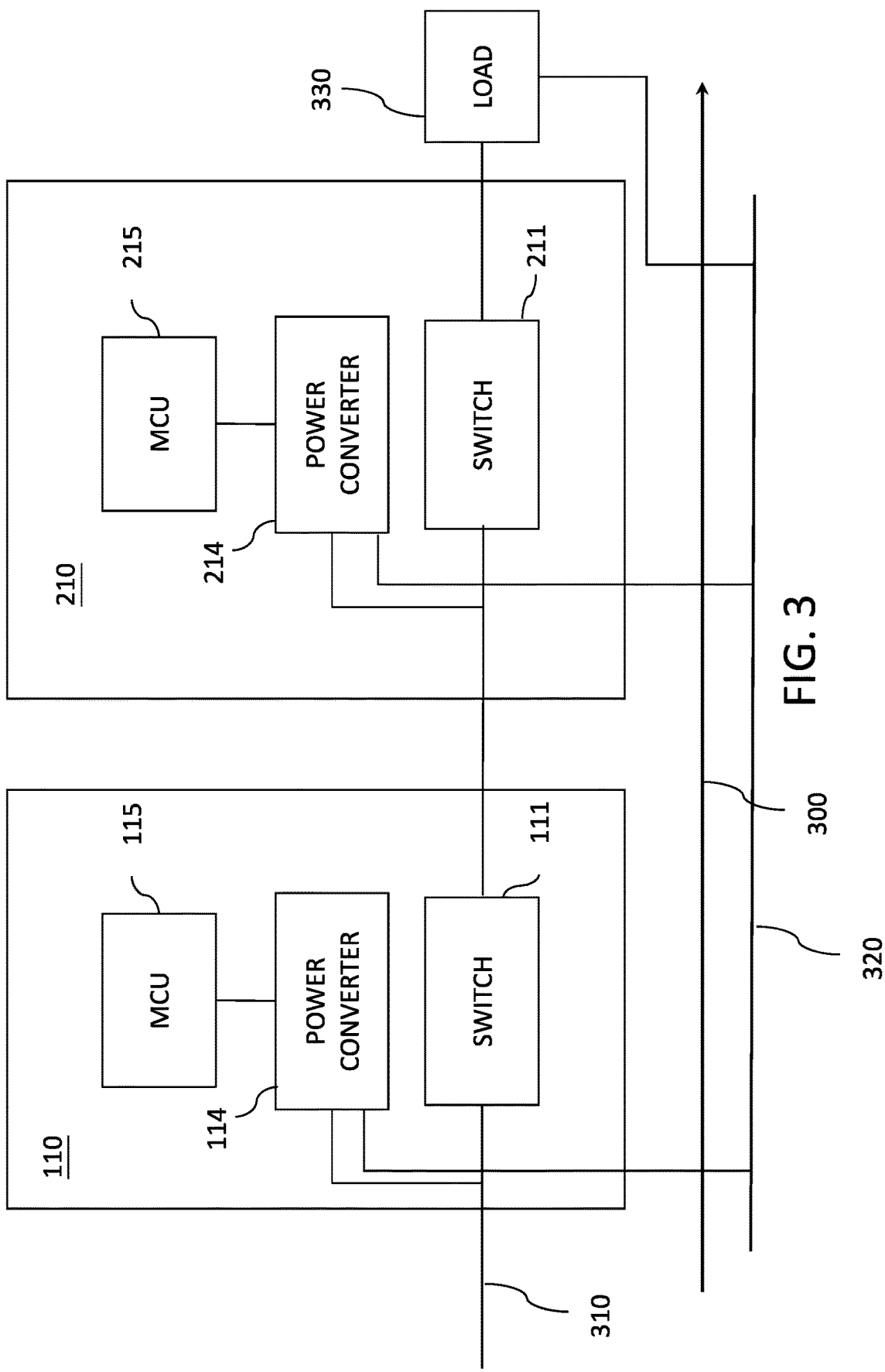
FIG. 3 is a schematic diagram of the power switches according to the third embodiment of the disclosure.

FIG. 3 is a schematic diagram of the power switch device according to the third embodiment of the disclosure.

The power switch device as shown in FIG. 3 includes two power switches 110 and 210. The power switch 110 includes a switch 111 having a power side and a load side adapted to connect to a load, a power converter 114, and a microprocessor 115. The power switch 210 includes a switch 211 having a power side and a load side adapted to connect to a load, a power converter 214, and a microprocessor 215. In this embodiment, the load side of the switch 111 of the power switch 110 is electrically connected to the power side of the switch 211 of the power switch 210.

The power converter 114 receives AC power and converts the AC power to DC power for powering the microprocessor 115. The power converter 214 receives AC power and converts the AC power to DC power for powering the microprocessor 215.

The arrow 300 indicates the direction of the current. In this embodiment, the current flows from the power switch 110 to the power switch 210. Therefore, the power switch 110 may be referred as the former stage, and the power switch 210 may be referred as the latter stage. If the current flows from the power switch 210 to the power switch 110, the power switch 210 may be referred as the former stage, and the power switch 110 may be referred as the latter stage.

The power side of the switch 111 is connected to the hot line 310. The load side of the switch 211 is connected to a load such as a lamp. The power converter 114, the power converter 214 and the load are also connected to the neutral line 320.

The microprocessor 115 may, by way of wireless means, send a control command having a control status corresponding to the current conduction state of the switch 111 in response to the conduction state of the switch 111 or controls the conduction state of the switch 111 in response to the received control command having a control status corresponding to the current conduction state of the switch 111. A wireless communication module (not shown) may be connected to the microprocessor 115 such that the microprocessor 115 may wirelessly send the control command. When sending the control command, the microprocessor 115 may enable the communication module to send the control command. The microprocessor 215 may, by way of wireless means, send a control command having a control status corresponding to the current conduction state of the switch 211 in response to the conduction state of the switch 211 or controls the conduction state of the switch 211 in response to the received control command having a control status corresponding to the current conduction state of the switch 211. A wireless communication module (not shown) may be connected to the microprocessor 215 such that the microprocessor 215 may wirelessly send the control command. When sending the control command, the microprocessor 215 may enable the communication module to send the control command.

For example, when the switch 111 is turned on, the microprocessor 115 detects the conduction state of the switch 111 to be ON. Thus, the microprocessor 115 sends a control command having an ON status in response to the ON conduction state of the switch 111. The microprocessor 215 receives the control command having the ON status by way of wireless means and controls the conduction state of the switch 211 to be ON. Thus, the load may be turned on.

When the switch 111 is turned off, the microprocessor 115 detects the conduction state of the switch 111 to be OFF. Thus, the microprocessor 115 sends a control command having an off status in response to the OFF conduction state of the switch 111. The microprocessor 215 receives the control command having the OFF status by way of wireless means and controls the conduction state of the switch 211 to be OFF. Thus, the load may be turned off.

On the other hand, when the switch 211 is turned on, the microprocessor 215 detects the conduction state of the switch 211 to be ON. Thus, the microprocessor 215 sends a control command having an ON status in response to the ON conduction state of the switch 211. The microprocessor 115 receives the control command having the ON status by way of wireless means and controls the conduction state of the switch 111 to be ON. Thus, the load may be turned on.

When the switch 211 is turned off, the microprocessor 215 detects the conduction state of the switch 211 to be OFF. Thus, the microprocessor 215 sends a control command having an OFF status in response to the OFF conduction state of the switch 211. Although the microprocessor 115 receives the control command having the OFF status by way of wireless means, the microprocessor 115 still controls the conduction state of the switch 111 to be ON such that the switch 111 of the former stage may function normally.

Figure 4:
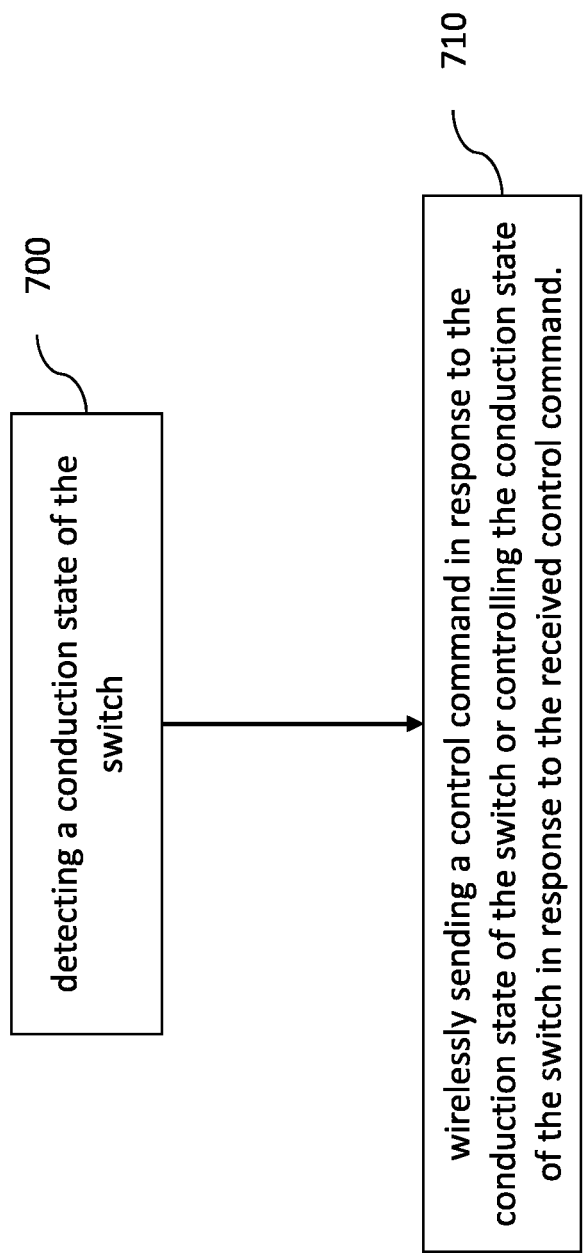
FIG. 4 is a flow chart showing the control method of the power switches according to the fourth embodiment of the disclosure.

FIG. 4 is a flow chart showing the control method of the power switches according to the fourth embodiment of the disclosure.

The control method is adapted for a power switch comprising a switch having a load side adapted to connect to a load and a power side and a microprocessor. Refer to the description set forth for the configuration of the power switches.

In the embodiment, a conduction state of the switch is first detected by the microprocessor (Step 700).

For example, when the switch 111 is turned on, the microprocessor 115 detects the conduction state of the switch 111 to be ON. Or When the switch 111 is turned off, the microprocessor 115 detects the conduction state of the switch 111 to be OFF. Similarly, when switch 211 is turned on, the microprocessor 215 detects the conduction state of the switch 211 to be ON. When switch 211 is turned off, the microprocessor 215 detects the conduction state of the switch 211 to be OFF.

Then, the method involves with wirelessly sending a control command in response to the conduction state of the switch or controlling the conduction state of the switch in response to the received control command (Step 710).

For example, when the microprocessor 115 detects the conduction state of the switch 111 to be ON, the microprocessor 115 sends a control command having an ON status, which corresponds to the conduction state of the switch 111. Then, the microprocessor 215 wirelessly receives the control command having the ON status and controls the conduction state of the switch 211 to be ON to turn on the load. When the microprocessor 115 detects the conduction state of the switch 111 to be OFF, the microprocessor 115 sends a control command having an OFF status, which corresponds to the conduction state of the switch 111. Then, the microprocessor 215 wirelessly receives the control command having the OFF status and controls the conduction state of the switch 211 to be OFF to turn off the load.

For example, when the microprocessor 215 detects the conduction state of the switch 211 to be ON, the microprocessor 215 sends a control command having an ON status, which corresponds to the conduction state of the switch 211. Then, the microprocessor 115 receives the control command having the ON status by way of wireless means and controls the conduction state of the switch 111 to be ON to turn on the load. When the microprocessor 215 detects the conduction state of the switch 211 to be OFF, the microprocessor 215 sends a control command having an OFF status, which corresponds to the conduction state of the switch 211. Then, the microprocessor 115 receives the control command having the OFF status by way of wireless means and the microprocessor 115 still controls the conduction state of the switch 111 to be ON such that the switch 111 of the former stage may function normally.

It is to be understood that the term "comprises", "comprising", or any other variants thereof, is intended to encompass a non-exclusive inclusion, such that a process, method, article, or device of a series of elements not only includes those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A switch assembly, comprising:
   a first power switch; and
   a second power switch,
   wherein each of the first and second power switches comprises:
      a single pole double throw (SPDT) switch having a common side and a switch side, wherein the switch side of the SPDT switch of the first power switch is electrically connected to the switch side of the SPDT switch of the second power switch;
      a first isolation switch electrically connected at the common side of the SPDT switch;
      a second isolation switch electrically connected at the switch side of the SPDT switch;
      a microprocessor for detecting a current direction and controlling the conduction state of one of the first isolation switch and the second isolation switch in response to the detected current direction; and
      a power converter converting AC power to DC power for powering the first isolation switch, the second isolation switch and the microprocessor.

2. The switch assembly according to claim 1, wherein when the current flows from the common side of the SPDT switch to the switch side of the SPDT switch, the microprocessor controls the conduction of one of the first isolation switch and the second isolation switch to be off.

3. The switch assembly according to claim 1, wherein when the current flows from the switch side of the SPDT switch to the common side of the SPDT switch, the microprocessor controls the conduction of the first isolation switch to be off.

4. The switch assembly according to claim 1, wherein the first isolation switch is a photo coupler or a photo triac.

5. The switch assembly according to claim 1, wherein the second isolation switch is a photo coupler or a photo triac.

6. A control method for a switch assembly comprising a first power switch and a second power switch, each of the first and second power switches comprising a single pole double throw (SPDT) switch having a common side and a switch side, a first isolation switch electrically connected at the common side of the SPDT switch, and a second isolation switch electrically connected at the switch side, wherein the switch side of the SPDT switch of the first power switch is electrically connected to the switch side of the SPDT switch of the second power switch, the method comprising:

detecting a current direction from the first isolation switch to the second isolation switch or from the second isolation switch to the first isolation switch in the first power switch;

controlling the conduction state of one of the first isolation switch and the second isolation switch in response to the detected current direction in the first power switch;

detecting a current direction from the first isolation switch to the second isolation switch or from the second isolation switch to the first isolation switch in the second power switch; and controlling the conduction state of one of the first isolation switch and the second isolation switch in response to the detected current direction in the second power switch.

7. The control method according to claim 6, wherein when the current flows from the common side of the SPDT switch to the switch side of the SPDT switch in the first power switch, the method comprises controlling the conduction state of one of the first isolation switch and the second isolation switch to be off in the first power switch.

8. The control method according to claim 6, wherein when the current flows from the switch side of the SPDT switch to the common side of the SPDT switch in the second power switch, the method comprises controlling the conduction state of the first isolation switch to be off in the second power switch.

\* \* \* \* \*